United States Patent
Guzek et al.

(10) Patent No.: US 9,287,248 B2
(45) Date of Patent: Mar. 15, 2016

(54) EMBEDDED MEMORY AND POWER MANAGEMENT SUBPACKAGE

(71) Applicant: INTEL CORPORATION, Santa Clara, CA (US)

(72) Inventors: John S. Guzek, Chandler, AZ (US); Debendra Mallik, Chandler, AZ (US); Sasha N. Oster, Chandler, AZ (US); Timothy E. McIntosh, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 41 days.

(21) Appl. No.: 14/104,877

(22) Filed: Dec. 12, 2013

(65) Prior Publication Data

US 2015/0171065 A1    Jun. 18, 2015

(51) Int. Cl.
| | |
|---|---|
| H01L 23/52 | (2006.01) |
| H01L 25/18 | (2006.01) |
| H01L 25/00 | (2006.01) |
| H01L 23/00 | (2006.01) |
| H01L 23/48 | (2006.01) |
| H01L 23/31 | (2006.01) |
| H01L 23/367 | (2006.01) |
| H01L 23/538 | (2006.01) |
| H01L 23/498 | (2006.01) |

(52) U.S. Cl.
CPC ............ *H01L 25/18* (2013.01); *H01L 23/3128* (2013.01); *H01L 23/3675* (2013.01); *H01L 23/481* (2013.01); *H01L 23/5384* (2013.01); *H01L 23/5389* (2013.01); *H01L 24/17* (2013.01); *H01L 25/50* (2013.01); *H01L 23/49816* (2013.01); *H01L 2224/16145* (2013.01); *H01L 2224/16235* (2013.01); *H01L 2924/1205* (2013.01); *H01L 2924/1206* (2013.01); *H01L 2924/1427* (2013.01); *H01L 2924/1432* (2013.01); *H01L 2924/1434* (2013.01); *H01L 2924/15321* (2013.01); *H01L 2924/182* (2013.01)

(58) Field of Classification Search
CPC ..... H01L 25/18; H01L 23/3157; H01L 24/17; H01L 23/481
USPC ........................................................ 257/777
See application file for complete search history.

(56) References Cited

U.S. PATENT DOCUMENTS

| | | | | |
|---|---|---|---|---|
| 7,838,337 | B2 * | 11/2010 | Marimuthu et al. | 438/110 |
| 8,026,584 | B2 * | 9/2011 | Kim | 257/686 |
| 8,269,337 | B2 * | 9/2012 | Hu et al. | 257/700 |
| 8,618,654 | B2 * | 12/2013 | Sutardja et al. | 257/723 |
| 2012/0273946 | A1 * | 11/2012 | Kim et al. | 257/738 |

* cited by examiner

*Primary Examiner* — Luan C Thai
(74) *Attorney, Agent, or Firm* — Schwabe, Williamson & Wyatt, P.C.

(57) ABSTRACT

Embodiment of the present disclosure describe integrated circuit package assemblies that allow for relatively short connections between devices such as a processor and memory. In one embodiment, a package assembly includes a die embedded in a subpackage directly coupled to another die attached to the subpackage. In some embodiments the subpackage may also contain power management devices. In some embodiments the die embedded in the subpackage and/or the power management device may overlap, or be located in, a region defined by the die coupled to the subpackage such that they are located between the die coupled to the subpackage and a substrate underlying the subpackage. Other embodiments may be described and/or claimed.

20 Claims, 6 Drawing Sheets

EMBEDDED MEMORY AND POWER MANAGEMENT SUBPACKAGE

Embodiments of the present disclosure generally relate to the field of integrated circuits, and more particularly, to integrated circuit package assemblies including a memory and/or power management subpackage, as well as methods for fabricating such integrated circuit package assemblies.

BACKGROUND

As integrated circuit package assemblies become smaller and more complex it has become challenging to efficiently route signals between different components. Increasing the length and/or complexity of conductive pathways may limit bandwidth between components such as a processor and memory. Also, lengthy and/or complicated power delivery pathways can increase losses and decrease overall power efficiency. Current techniques tend to place components in a single plane, establishing effective minimum lengths for conductive pathways based on the size and spatial arrangement of the components to be connected.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
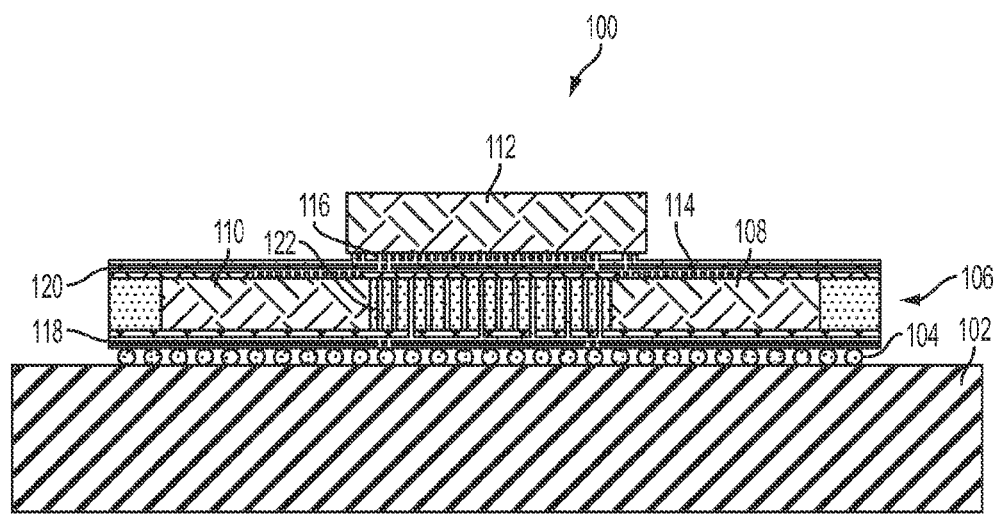
FIG. 1 schematically illustrates a cross-section side view of a package assembly including a subpackage, in accordance with some embodiments.

Embodiments of the present disclosure describe integrated circuit package assemblies that allow for relatively short connections between devices such as a processor or central processing unit (CPU) and memory. By creating short simple conductive paths it may be possible to increase memory bandwidth. Embodiments of the present disclosure also describe integrated circuit package assemblies that provide efficient spatial arrangement of components to effectively utilize three-dimensional (3D) stacking with shortened connections and simplified power delivery.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with" along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

FIG. 1 illustrates a package assembly 100 in accordance with some embodiments. The package assembly 100 may include a subpackage 106 and a die 112 attached to the subpackage 106. The combination of the subpackage 106 and the die 112 may be attached to a package substrate or interposer 102 by package-level interconnects, such as a ball grid array (BGA) 104. The package substrate or interposer 102 may be attached to another package or mother board (not shown).

Subpackage 106 may include multiple dies such as, for example, dies 108 and 110. Dies 108 and 110 may be any type of die containing active or passive elements. In some embodiments, dies 108 and 110 may be memory dies. Dies 108 and 110 are attached to underlying layers 118. Underlying layers 118 may define conductive pathways for electrically coupling package-level interconnects, such as BGA 104 to pass through vias 122. Underlying layers 118 may be formed by any suitable process, including, but not limited to, a bumpless build up layer (BBUL) process. Pass through vias 122 may be formed generally in a central portion of the subpackage 106 to provide conductive paths from package-level interconnects, such as a BGA 104 and underlying layers 118 to an upper region (as seen in FIG. 1) of the subpackage 106.

The subpackage 106 may contain additional layers 120 in the upper region. The additional layers 120 may contain conductive pathways for electrically coupling dies 108 and/or 110 to die 112. Die 112 may be any type of die containing active or passive elements. In some embodiments, die 112 may include a processor or a central processor unit (CPU). In some embodiments, dies 108 and 110 may be memory dies and die 112 may include a processor or CPU. The additional layers 120 may also contain conductive pathways for electrically coupling dies 108, 110, and/or 112 to pass through vias 122 for connection to the lower side of the subpackage (as see in FIG. 1). The additional layers 120 may facilitate relatively short conductive paths 116 (labeled on left side of die 112 but present on both sides) between die 112 and dies 108 and/or 110. Conductive paths 116 may be located in an area where dies 108 and/or 110 overlap die 112 (lie underneath die 112 as seen in FIG. 1). By forming conductive paths 116 in this area, dies 108 and 110 may be connected to die 112 by short, simple paths potentially increasing the bandwidth of communications between dies 108 and/or 110 with die 112. This may be particularly beneficial in embodiments where dies 108 and/or 110 are memory dies and die 112 includes a processor or CPU. Additional conductive pathways 114 may be provided outside of the overlapping area to provide more contacts between dies 108 and/or 110 with 112 or between 108 and/or 110 and the pass through vias 122 as needed. In some embodiments conductive pathways 116 located in the overlap area may contain all of the connections between the dies 108 and/or 110 with die 112, while conductive pathways 114 may be used for routing power and/or signals between the dies 108 and/or 110 and the pass through vias 122.

Figure 2:
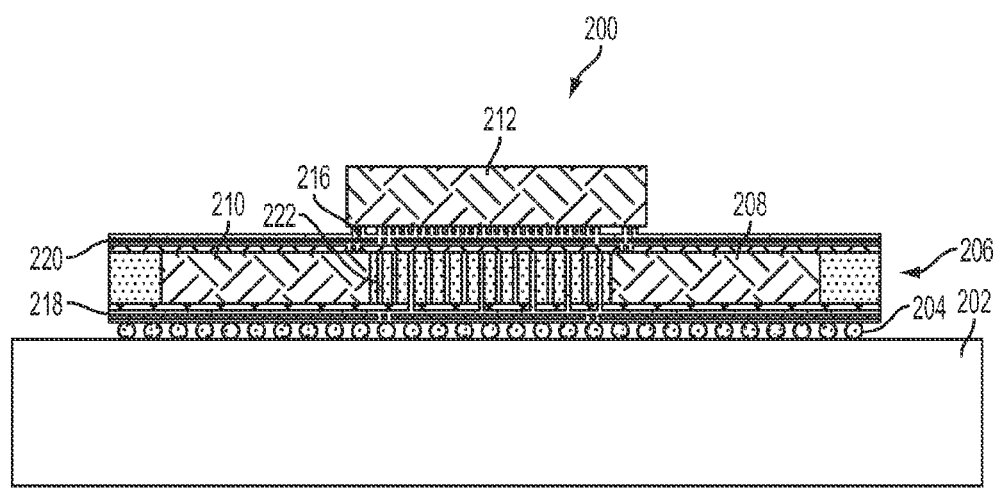
FIG. 2 schematically illustrates a cross-section side view of a package assembly including a subpackage, in accordance with some embodiments.

FIG. 2 illustrates a package assembly 200 in accordance with some embodiments. Package assembly 200 may include a subpackage 206 and a die 212 attached to a mother-board 202 via package-level interconnects, such as BGA 204. The subpackage 206 may contain multiple dies such as, for example, dies 208 and 210. Dies 208 and 210 may be any type of die containing active or passive elements. In some embodiments, dies 208 and 210 may be memory dies. Dies 208 and 210 are attached to underlying layers 218. Underlying layers 218 may define conductive pathways for electrically coupling package-level interconnects, such as a BGA 204 to pass through vias 222. Underlying layers 218 may be formed by any suitable process, including, but not limited to a bumpless build up layer (BBUL) process. Pass through vias 222 may be formed generally in a central portion of the subpackage 206 to provide a conductive path from package-level interconnects, such as a BGA 204 and underlying layers 218 to an upper region (as seen in FIG. 2) of the subpackage 206.

Subpackage 206 also may contain additional layers 220 in the upper region. The additional layers 220 may contain conductive pathways for electrically coupling dies 208 and/or 210 to die 212. Die 212 may be any type of die containing active or passive elements. In some embodiments die 212, may include a processor or CPU. In some embodiment dies 208 and 210 may be memory dies and die 212 may include a processor or CPU. The additional layers 220 may also contain conductive pathways for electrically coupling dies 208, 210, and 212 to pass through vias 222 for connection to the lower side of the subpackage (as seen in FIG. 2). The additional layers 220 may facilitate relatively short conductive paths 216 (labeled on left side of die 212 but present on both sides) between die 212 and dies 208 and/or 210. Conductive paths 216 may be located in an area where dies 208 and 210 overlap die 212 (lie underneath die 212 as seen in FIG. 2). Unlike FIG. 1, in FIG. 2 all of the die interconnects for dies 208 and/or 210 are located in an area below die 212 (as seen in FIG. 1). Additional conductive pathways (not labeled, below center of die 212) may be located in a generally central portion of die 212 to electrically couple die 212 to pass through vias 222.

Figure 3:
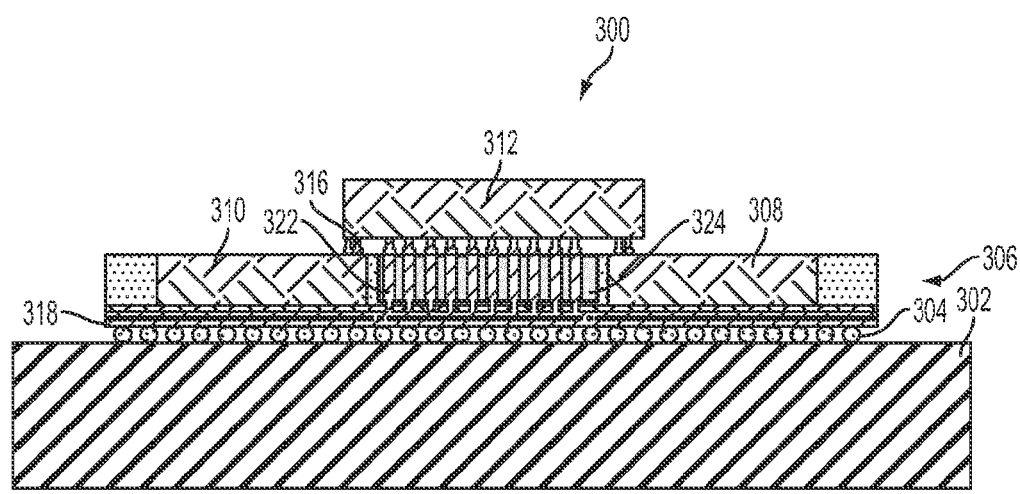
FIG. 3 schematically illustrates a cross-section side view of a package assembly utilizing direct face-to-face coupling, in accordance with some embodiments.

FIG. 3 illustrates a package assembly 300 in accordance with some embodiments. Package assembly 300 may include a subpackage 306 and a die 312 attached to a package substrate or interposer 302 via package-level interconnects, such as BGA 304. The subpackage 306 may include multiple dies such as, for example, dies 308 and 310. Dies 308 and 310 may be any type of die containing active or passive elements. In some embodiments, dies 308 and 310, may be memory dies. Dies 308 and 310 are attached to underlying layers 318. Underlying layers 318 may define conductive pathways for electrically coupling package-level interconnects, such as a BGA 304 to pass through vias 322. Underlying layers 318 may be formed by any suitable process, including, but not limited to a bumpless build up layer (BBUL) process. Pass through vias 322 may be formed generally in a central portion of the subpackage 306 to provide a conductive path from package-level interconnects, such as a BGA 304 and underlying layers 318 to an upper region (as seen in FIG. 3 of the subpackage 306).

The subpackage 306 may also contain a power management device 324 located in the central region of the subpackage 306. Power management device 324 may include active or passive elements including, but not limited to, capacitors, inductors, and/or voltage regulator modules. Although shown as a single device power management device 324 may include more than one power management device. For instance, if die 312 includes a multiprocessor chip, there may be a separate voltage regulator module for each processor on die 312. Pass through vias 322 may be formed in power management device 324 to allow electrical coupling of underlying layers 318 to the upper region of the subpackage. Additionally, conductive pathways (not specifically shown) may be included to electrically couple any of dies 308, 310, 312 to power management device 324 to receive power therefrom. In some embodiments the power management device 324 may be located entirely in an area defined by die 312, as seen in FIG. 3, such as a die shadow area located directly underneath and entirely within terminating edges of die 312. That is, the die shadow area may have a same area as the die 312 from a top view perspective.

Unlike FIGS. 1 and 2, FIG. 3 does not include additional layers in the upper region of subpackage 306. Instead, the upper surface of dies 308 and 310 are exposed. This allows for direct face-to-face coupling of die 312 to dies 308 and/or 310 by contacts 316. The direct face-to-face coupling may be achieved by any suitable structures including, but not limited to bumps, pillars or other structures. As with FIGS. 1 and 2, contacts 316 provide short simple connections that may provide increased bandwidth. This may be particularly advantageous where dies 308 and 310 are memory dies and die 312 contains a processor. In the arrangement shown in FIG. 3 dies 308 and/or 310 may receive power via die 312 because dies 308 and/or 310 are not directly electrically coupled to the underlying layers 318. In some embodiments, dies 308 and/or 310 are only directly electrically coupled to die 312.

Figure 4:
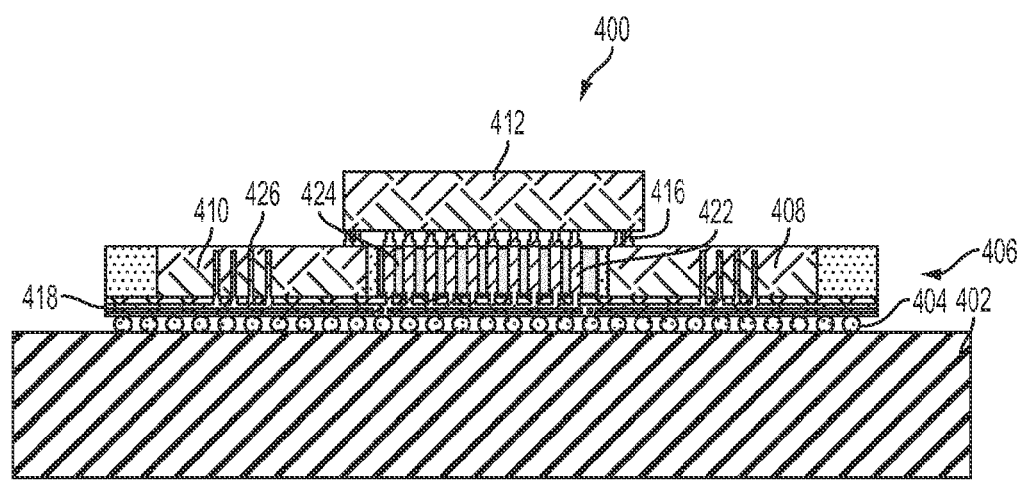
FIG. 4 schematically illustrates a cross-section side view of a package assembly utilizing direct face-to-face coupling and through silicon vias, in accordance with some embodiments.

FIG. 4 illustrates a package assembly 400 in accordance with some embodiments. Package assembly 400 may include a subpackage 406 and a die 412 attached to a package substrate or interposer 402 via package-level interconnects, such as BGA 404. The subpackage 406 may include multiple dies such as, for example, dies 408 and 410. Dies 408 and 410 may be any type of die containing active or passive elements. In some embodiments, dies 408 and 410, may be memory dies. Dies 408 and 410 are attached to underlying layers 418. Underlying layers 418 may define conductive pathways for electrically coupling package-level interconnects, such as a BGA 404 to pass through vias 422. Underlying layers 418 may be formed by any suitable process, including, but not limited to, a bumpless build up layer (BBUL) process. Pass through vias 422 may be formed generally in a central portion of the subpackage 406 to provide a conductive path from package-level interconnects, such as a BGA 404 and underlying layers 418 to an upper region (as seen in FIG. 4 of the subpackage 406).

The subpackage 406 may also contain a power management device 424. Power management device 424 may be arranged and configured as discussed above regarding 324 in FIG. 3. Contacts 416 may be arranged and configured as discussed above regarding contacts 316 in FIG. 3. Die 412 may any type of die, including a processor die as discussed previously.

In contrast to FIG. 3, dies 408 and 410 may include through silicon vias (TSVs) 426 (labeled in die 410, but present in die 408 as well). TSVs 426 may electrically couple dies 408 and/or 410 to BGA 404 via conductive pathways in underlying layers 418. In this manner dies 408 and/or 410 may receive power and/or signals directly via TSVs 426 as opposed to being exclusively coupled to die 412 (as discussed above relative to die 312 in FIG. 3).

Figure 7:
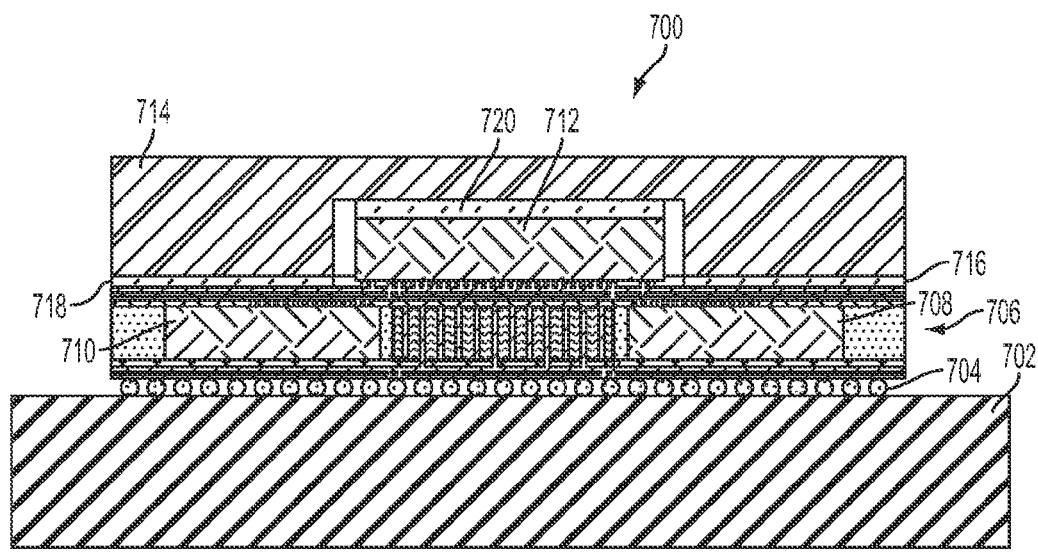
FIG. 7 schematically illustrates a cross-section side view of a package assembly including a package heat spreader, in accordance with some embodiments.

The configuration shown in FIGS. 3 and 4 may provide improved thermal characteristics because a heat spreader (as shown in FIG. 7) may be located in close proximity to the dies 308 and 310 without intervening additional layers (such as 120 and 220 in FIGS. 1 and 2).

Figure 5:
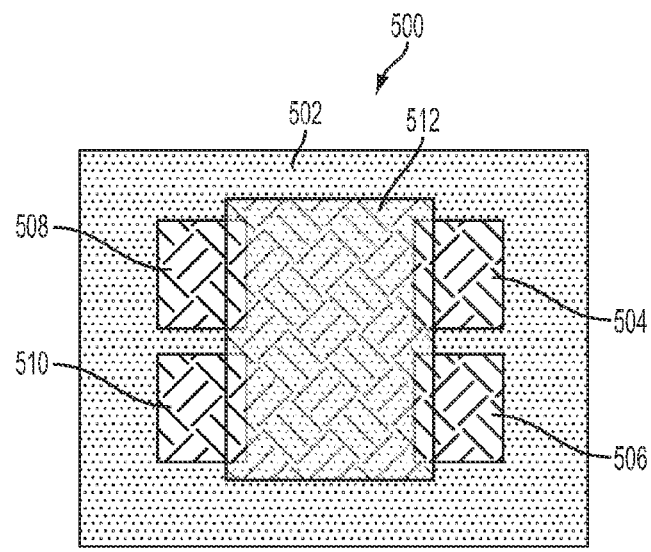
FIG. 5 schematically illustrates an overhead view of a package assembly, in accordance with some embodiments.

FIG. 5 illustrates a top view of a package assembly 500 consistent with package assemblies 100-400 of FIGS. 1-4. The package assembly 500 may include a subpackage 502 which includes multiple dies such as, for example, four dies 504, 506, 508 and 510. Dies 504, 506, 508 and 510 may correspond to dies 108-408 and 110-410 in FIGS. 1-4 (as well as similar dies in subsequent FIGs). The package assembly 500 may also include a die 512, which may correspond to dies 112-412 in FIGS. 1-4 (as well as similar dies in subsequent figures). In FIG. 5 the area in which dies 504, 506, 508 and 510 overlap die 512 can be seen more clearly. As discussed previously, contacts may be formed in this overlapping region to electrically couple dies 504, 506, 508 and 510 with die 512 to provide short simple contacts. Although not shown in FIG. 5, power management devices (such as power management devices 324, 424 in FIGS. 3-4) may be located underneath die 512 such that the power management devices are located entirely within the area defined by die 512.

Figure 6:
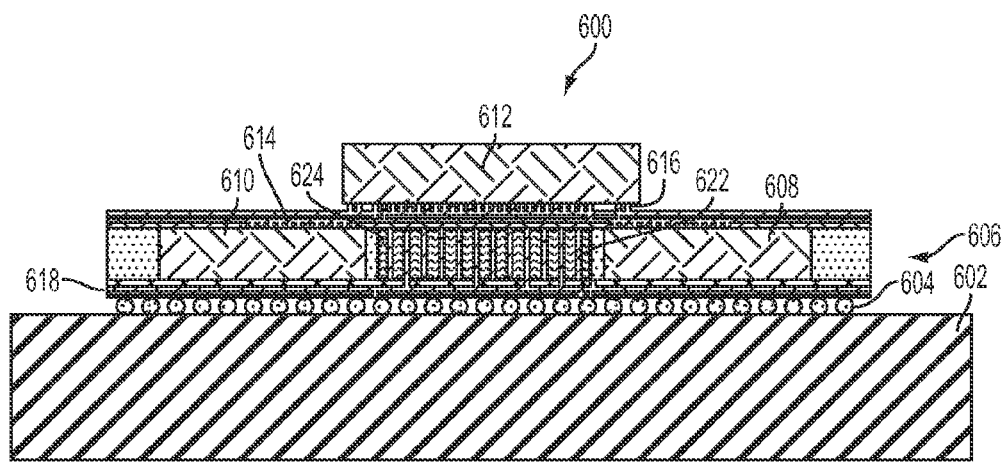
FIG. 6 schematically illustrates a cross-section side view of a package assembly including a subpackage with a power management device, in accordance with some embodiments.

FIG. 6 illustrates a package assembly 600 in accordance with some embodiments. The package assembly 600 may include a subpackage 606 and a die 612 attached to the subpackage 606. The combination of the subpackage 606 and the die 612 may be attached to a package substrate or interposer 602 by package-level interconnects, such as a BGA 604. The package substrate or interposer 602 may be attached to another package or mother-board (not shown). FIG. 6 is similar to FIG. 1 except that FIG. 6 also includes a power management device 624 (similar to power management devices 324 and 424 in FIGS. 3-4).

Subpackage 606 may include multiple dies such as, for example, dies 608 and 610. Dies 608 and 610 may be any type of die containing active or passive elements. In some embodiments dies 608 and 610, may be memory dies. Dies 608 and 610 are attached to underlying layers 618. Underlying layers 618 may define conductive pathways for electrically coupling package-level interconnects, such as a BGA 604 to pass through vias 622. Underlying layers 618 may be formed by any suitable process, including, but not limited to a bumpless build up layer (BBUL) process. Pass through vias 622 may be formed generally in a central portion of the subpackage 606 to provide a conductive path from package-level interconnects, such as a BGA 604 and underlying layers 618 to an upper region (as seen in FIG. 6) of the subpackage 606.

Power management device 624 may be consistent with power management devices 324 and 424 as discussed above relative to FIGS. 3 and 4. Pass through vias 622 and electrical connections may be formed as discussed above relative to FIGS. 3 and 4.

The subpackage 606 may contain additional layers in the upper region (not labeled). The additional layers may contain conductive pathways for electrically coupling dies 608 and/or 610 to die 612. Die 612 may be any type of die containing active or passive elements. In some embodiments die 612, may include a processor or CPU. In some embodiment dies 608 and 610 may be memory dies and die 612 may be a CPU die. The additional layers may also contain conductive pathways for electrically coupling dies 608, 610, and 612 to pass through vias 622 for connection to the lower side of the subpackage (as seen in FIG. 6). The additional layers may facilitate relatively short conductive paths 616 (labeled on left side of 612 but present on both sides) between die 612 and dies 608 and/or 610. Conductive paths 616 may be located in an area where dies 608 and/or 610 overlap die 612 (lie underneath die 612 as seen in FIG. 6). By forming conductive paths 616 in this area, dies 608 and/or 610 may be connected to die 612 by short, simple paths potentially increasing the bandwidth of communications between dies 608 and/or 610 with 612. This may be particularly beneficial in embodiments where dies 608 and/or 610 are memory dies and die 612 is includes a processor or CPU. Additional conductive pathways 614 may be provided outside the overlapping area to provide more contacts between dies 608 and/or 610 with 612 or between 608 and/or 610 and the pass through vias 622 as needed. In some embodiments conductive pathways 616 located in the overlap area may contain all of the connections between the dies 608 and/or 610 with die 612, while conductive pathways 614 may be used for routing power and/or signals between the dies 608 and/or 610 and the pass through vias 622.

FIG. 7 illustrates a package assembly 700 in accordance with some embodiments. Similar to package assemblies discussed previously, the package assembly 700 may include a subpackage 706 and a die 712 attached to the subpackage 706. The combination of the subpackage 706 and the die 712 may be attached to a package substrate or interposer 702 by package-level interconnects, such as a BGA 704. The package substrate or interposer 702 may be attached to another package or mother-board (not shown). Some elements are not labeled in FIG. 7 for clarity.

Subpackage 706 may include multiple dies such as, for example, dies 708 and 710. Dies 708 and 710 may be similar to dies 108-608 and 110-610 discussed previously. Die 712 may be similar to dies 112-612 discussed previously. Subpackage 706 may also include a package heat spreader 714 for removing heat from dies 708, 710, and 712. Package heat spreader 714 is thermally coupled to dies 708 and 710 by thermal interface material (TIM) regions 716 and 718, respectively. Package heat spreader 714 may also be thermally coupled to die 712 by TIM region 720. TIM regions 716, 718, and 720 provide a thermal pathway for heat to pass from dies 708, 710, and 712 respectively into package heat spreader 714. Any of the package assemblies disclosed herein may include a package heat spreader similar to package heat spreader 714 in FIG. 7.

Figure 8:
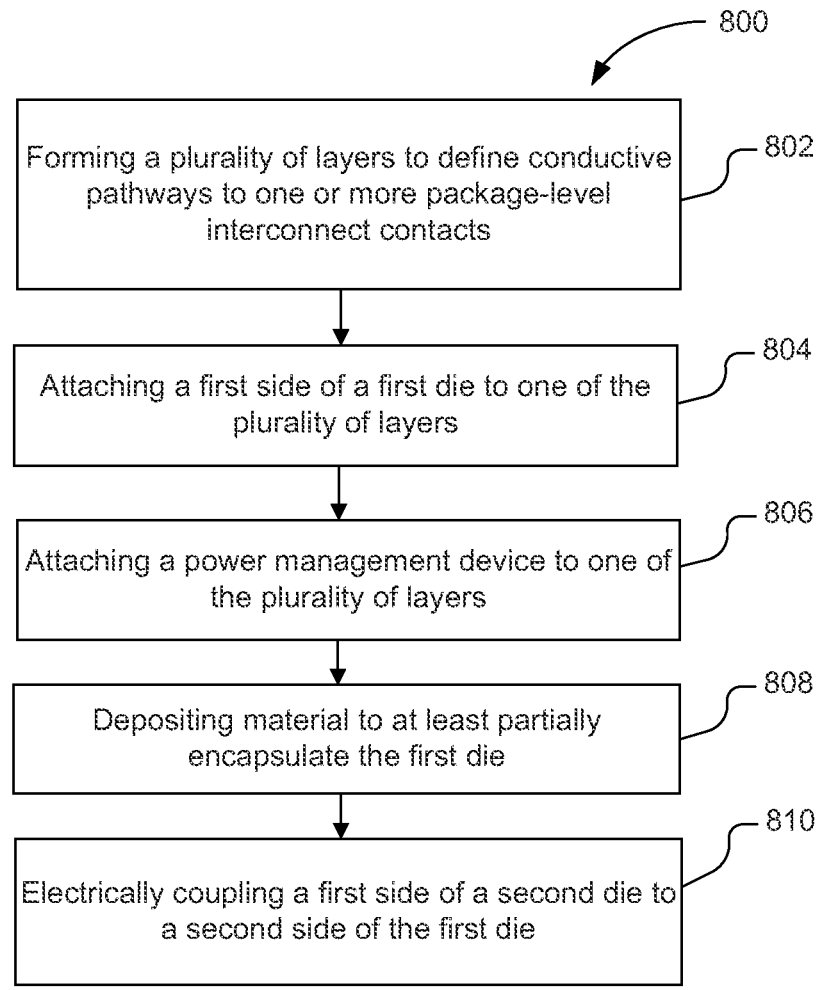
FIG. 8 schematically illustrates a flow diagram of a method of fabricating a package assembly, in accordance with some embodiments.

FIG. 8 illustrates a method 800 for forming package assemblies in accordance with some embodiments. The method 800 begins at 802 with forming a plurality of layers (such as underlying layers 118-418 and 618 in FIGS. 1-4 and 6) to define conductive pathway to one or more package-level interconnect contacts (such as BGAs 104-404 and 604 in FIGS. 1-4 and 6). Any suitable technique, including but not limited to, a BBUL process may be utilized for 802.

At 804, the method 800 continues with attaching a first side of a first die (such as dies 108-708 or 110-710 in FIGS. 1-7) to one of the plurality of layers. 804 may include attaching multiple dies to one of the plurality of layers. Any suitable attachment technique may be used for 804.

At 806, the method 800 continues with attaching a power management device (such as power management device 324, 424, 624) to one of the plurality of layers. Any suitable attachment technique may be used for 806. 806 may include attaching multiple power management devices to one of the plurality of layers. This operation is optional and is may be performed if the package assembly is to include one or more power management devices.

At 808, the method 800 continues with depositing material to at least partially encapsulate the first die. 808 may involve any suitable material deposition technique. In addition to the first die, 808 may partially encapsulate any additional dies or power management devices previously attached.

At 810, the method 800 continues with electrically coupling a first side of second die (such as dies 112-712 of FIGS. 1-7) to a second side of the first die (such as dies 108-708 or 110-710 in FIGS. 1-7). 810 may include forming conductive pathways or contacts such as 116-416 and 616 of FIGS. 1-4 and 6.

Various operations are described as multiple discrete operations in turn, in a manner that is most helpful in understanding the claimed subject matter. However, the order of description should not be construed as to imply that these operations are necessarily order dependent.

Figure 9:
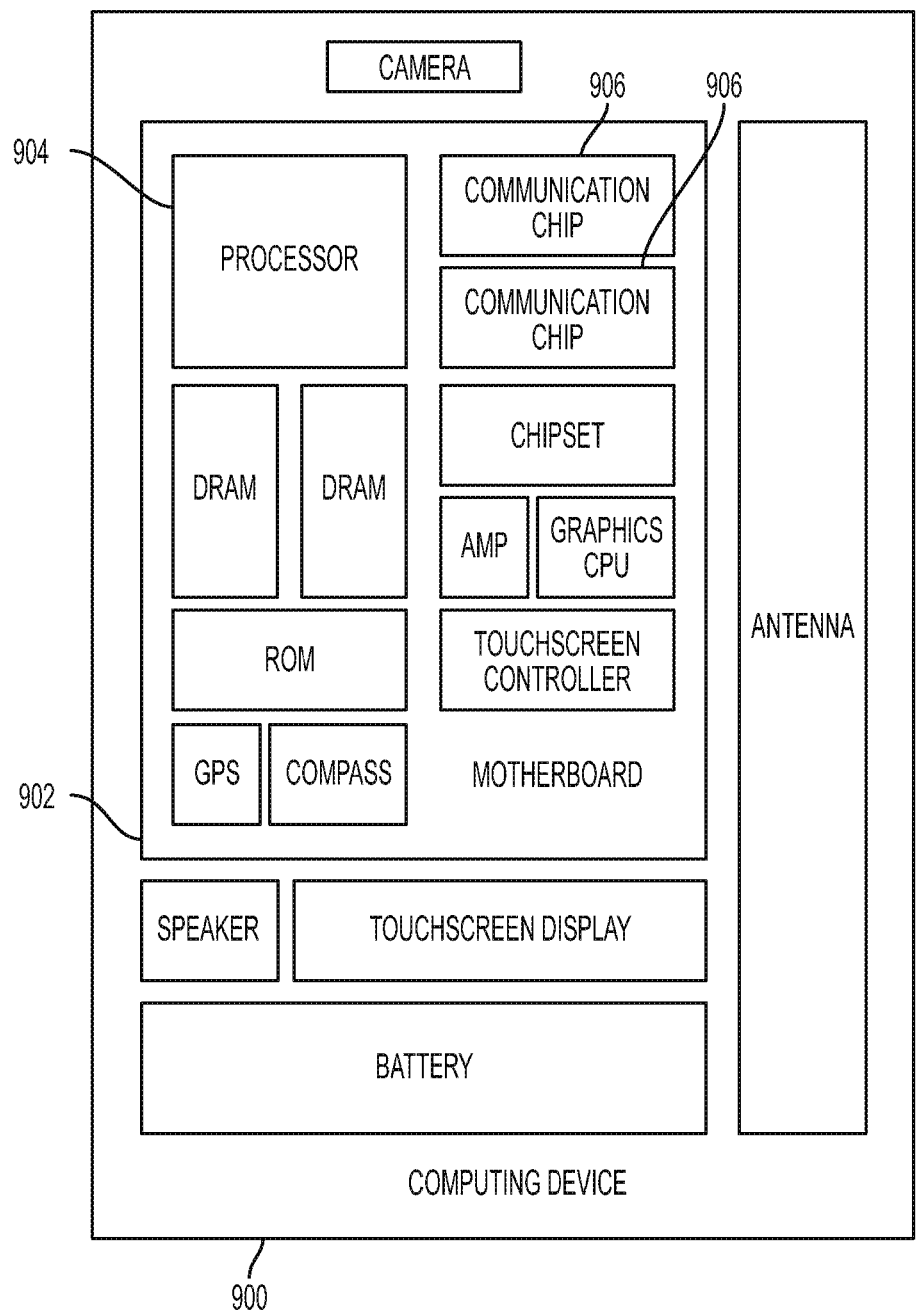
FIG. 9 schematically illustrates a computing device that includes a package assembly as described herein, in accordance with some embodiments.

Embodiments of the present disclosure may be implemented into a system using any suitable hardware and/or software to configure as desired. FIG. 9 schematically illustrates a computing device 900 that includes an IC package assembly (e.g., one or more of package assemblies 100-700 of FIGS. 1-7) as described herein, in accordance with some embodiments. The computing device 900 may include housing to house a board such as mother-board 902. Mother-board 902 may include a number of components, including but not limited to processor 904 and at least one communication chip 906. Processor 904 may be physically and electrically coupled to mother-board 902. In some implementations, the at least one communication chip 906 may also be physically and electrically coupled to mother-board 902. In further implementations, communication chip 906 may be part of processor 904.

Depending on its applications, computing device 900 may include other components that may or may not be physically and electrically coupled to mother-board 902. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

Communication chip 906 may enable wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 906 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. Communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 906 may operate in accordance with other wireless protocols in other embodiments.

Computing device 900 may include a plurality of communication chips 906. For instance, a first communication chip 906 may be dedicated to shorter range wireless communications such as Wi-Fi and Bluetooth, and a second communication chip 906 may be dedicated to longer range wireless communications such as GPS, EDGE, GPRS, CDMA, WiMAX, LTE, Ev-DO, and others.

Processor 904 of computing device 900 may be packaged in an IC assembly (e.g., package assemblies 100-700 of FIGS. 1-7) as described herein. For example, processor 904 may correspond with one of dies 112-712. The package assembly (e.g., package assemblies 100-700 of FIGS. 1-7) and mother-board 902 may be coupled together using package-level interconnects such as BGA balls (e.g., 104-404 and 604 of FIGS. 1-4 and 6). The term "processor" may refer to any device or portion of a device that processes electronic data from registers and/or memory to transform that electronic data into other electronic data that may be stored in registers and/or memory.

Communication chip 906 may also include a die (e.g., dies 112-712, 108-708, or 110-710 of FIGS. 1-7) that may be packaged in an IC assembly (e.g., package assemblies 100-700 of FIGS. 1-7) as described herein. In further implementations, another component (e.g., memory device or other integrated circuit device) housed within computing device 900 may include a die (e.g., dies 112-712, 108-708, or 110-710 of FIGS. 1-7) that may be packaged in an IC assembly (e.g., package assemblies 100-700 of FIGS. 1-7) as described herein.

In various implementations, computing device 900 may be a laptop, a netbook, a notebook, an Ultrabook™, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

EXAMPLES

Some non-limiting examples are provided below.

Example 1 includes a package assembly comprising: a subpackage having a first side and a second side disposed opposite to the first side, the subpackage including: one or more package-level interconnect contacts disposed on the first side; and a first die at least partially embedded in the subpackage, the first die having a first side and a second side disposed opposite to the first side, the first side of the first die being disposed between the second side of the first die and the first side of the subpackage; and a second die having a first side and a second side disposed opposite to the first side, the first side of the second die being coupled to the second side of the subpackage and electrically coupled to the second side of the first die.

Example 2 includes the package assembly of example 1, wherein: the subpackage includes a power management device at least partially embedded in the subpackage.

Example 3 includes the package assembly of example 2, wherein: the power management device has a first side and a second side disposed opposite to the first side; and a surface of the second side of the power management device overlaps a surface of the first side of second die in a direction perpendicular to the surface of the first side of the second die.

Example 4 includes the package assembly of example 3, wherein: the power management device is entirely disposed within an area defined by the surface of the first side of the second die in a direction perpendicular to the surface of the first side of the second die.

Example 5 includes the package assembly of any of examples 2-4, wherein: the power management device includes one or more of a capacitor, an inductor, or a voltage regulation module.

Example 6 includes package assembly of example 1 wherein: a surface of the second side of the first die overlaps a surface of the first side of the second die in a direction perpendicular to the surface of the second side of the first die.

Example 7 includes package assembly of example 6, wherein: the second die is electrically coupled to the second side of the first die in a portion of the surface of the second side of first die that overlaps the surface of the first side of the second die.

Example 8 includes the package assembly of example 7, wherein: the second die is directly electrically coupled to the second side of the first die using die-level interconnects.

Example 9 includes the package assembly of example 8 wherein: the first die includes at least one through silicon via (TSV) electrically coupling the first die to the first side of the subpackage.

Example 10 includes the package assembly of example 8 wherein: the first die receives power through the second die.

Example 11 includes the package assembly of any of examples 1-4 or 6-10, wherein: the first die-package includes a memory die and the second die-package includes a central processing unit (CPU).

Example 12 includes the package assembly of any of examples 1-4 or 6-10, wherein: the first die is embedded in a mold core of the subpackage and the subpackage includes one or more build-up layers coupled with the mold core on the second side of the subpackage including conductive pathways for electrically coupling the second die to the first side of the first die.

Example 13 includes the package assembly of any of examples 1-4 or 6-10, wherein: the second die is electrically coupled to at least one of the one or more package-level interconnect contacts by conductive pathways that connect the second side of the subpackage to the first side of the subpackage.

Example 14 includes the package assembly of any of examples 1-4 or 6-10, comprising: a third die at least partially embedded in the subpackage, the third die having a first side and a second side disposed opposite to the first side; wherein a surface of the second side of the first die and a surface of the second side of the third die each overlaps a surface of the first side of the second die in a direction perpendicular to the surface of the second side of the first die.

Example 15 includes a method of fabricating a package assembly, the method comprising: forming a plurality of layers to define conductive pathways to one or more package-level interconnect contacts; attaching a first side of a first die to one of the plurality of layers; depositing material to at least partially encapsulate the first die; and electrically coupling a first side of a second die to a second side of the first die that is disposed opposite to the first side of the first die such that a surface of the first side of the second die overlaps a surface of the second side of the first die in a direction perpendicular to the surface of the first side of the second die.

Example 16 includes the method of example 15, wherein: attaching the first side of the first die to one of the plurality of layers includes aligning a contact on the first side of the first die with a conductive pathway defined in the plurality of layers.

Example 17 includes the method of example 15, comprising: attaching a power management device to one of the plurality of layers prior to depositing material to at least partially encapsulate the first die; wherein depositing material to at least partially encapsulate the first die also at least partially encapsulates the power management device.

Example 18 includes the method of any of examples 15-17, wherein: electrically coupling the first side of the second die to the second side of the first die includes electrically coupling the first side of the second die to the second side of the first die in a region of the surface of the first side of the second die that overlaps the surface of the second side of the first die in a direction perpendicular to the surface of the first side of the second die.

Example 19 includes the method of any of examples 15-17, wherein the second side of the first die remains exposed after depositing material to at least partially encapsulate the first subpackage die and electrically coupling the first side of the second die to the second side of the first die includes directly electrically coupling the first side of the second die to the second side of the first die using die-level interconnects.

Example 20 includes the method of any of examples 15-17, comprising: attaching a first side of a third die to one of the plurality of layers prior to depositing material to at least partially encapsulate the first die.

Example 21 includes a computing device comprising: a circuit board; and a subpackage having a first side and a second side disposed opposite to the first side, the first side being coupled with the circuit board using one or more package-level interconnects disposed on the first side, the subpackage including: a first die at least partially embedded in the subpackage, the first die having a first side and a second side disposed opposite to the first side, the first side of the first die being disposed between the second side of the first die and the first side of the subpackage; and a second die having a first side and a second side disposed opposite to the first side, the first side of the second die being coupled to the second side of the subpackage and electrically coupled to the second side of the first die.

Example 22 includes the computing device of example 21, wherein: the subpackage includes a power management device at least partially embedded in the subpackage and located at least partially in a region between the first side of the second die and the circuit board in direction perpendicular to the surface of the first side of the second die.

Example 23 includes the computing device of example 21, wherein: the second die is directly electrically coupled to the second side of the first die.

Example 24 includes the computing device of example 21, wherein: the second die is electrically coupled to the second side of the first die in a portion of a surface of the second side of first die that overlaps a surface of the first side of the second die in a direction perpendicular to the second side of the first die.

Example 25 includes the computing device of any of examples 21-24, wherein: the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A package assembly comprising:
a subpackage having a first side and a second side disposed opposite to the first side, the subpackage including:
   one or more package-level interconnect contacts disposed on the first side the subpackage; and
   a first die having a first side and a second side disposed opposite to the first side, the first side of the first die being disposed between the second side of the first die and the first side of the subpackage; and
a second die having a first side and a second side disposed opposite to the first side, the first side of the second die being coupled to the second side of the subpackage and electrically coupled to the second side of the first die, wherein a first portion of the first die is within an area defined b extension of a perimeter of the second die in a direction perpendicular to the first side of the second die, wherein a second portion of the first die extends outside of the area defined by the extension of the perimeter of the second die in the direction perpendicular to the first side of the second die, wherein the subpackage includes one or more conductive pathways located between the second side of the first die and the second side of the subpackage, and wherein the one or more conductive pathways are coupled to the second portion of the first die that extends outside of the area defined by the extension of the perimeter of the second die in the direction perpendicular to the first side of the second die.

2. The package assembly of claim 1, wherein:
the first die includes a memory die and the second die includes a central processing unit (CPU).

3. The package assembly of claim 2, wherein:
the first die is embedded in a mold core of the subpackage and the subpackage includes one or more build-up layers coupled with the mold core on the second side of the subpackage including conductive pathways for electrically coupling the second die to the first side of the first die.

4. The package assembly of claim 1, wherein:
the second die is electrically coupled to the second side of the first die in the first portion of the first die.

5. The package assembly of claim 4, wherein:
the second die is directly electrically coupled to the second side of the first die using die-level interconnects.

6. The package assembly of claim 5 wherein:
the first die is configured to receive power through the second die.

7. The package assembly of claim 1, wherein:
the second die is electrically coupled to at least one of the one or more package-level interconnect contacts by conductive pathways that connect the second side of the subpackage to the first side of the subpackage.

8. The package assembly of claim 1, comprising:
a third die at least partially embedded in the subpackage, the third die having a first side and a second side disposed opposite to the first side;
wherein a portion of the third die is within the area defined by the extension of the perimeter of the second die in the direction perpendicular to the first side of the second die.

9. A computing device comprising:
a circuit board;
a subpackage having a first side and a second side disposed opposite to the first side, the first side being coupled with the circuit board using one or more package-level interconnects disposed on the first side of the subpackage, the subpackage including:
 a first die having a first side and a second side disposed opposite to the first side, the first side of the first die being disposed between the second side of the first die and the first side of the subpackage; and
a second die having a first side and a second side disposed opposite to the first side, the first side of the second die being coupled to the second side of the subpackage and electrically coupled to the second side of the first die, wherein a first portion of the first die is within an area defined b extension of a perimeter of the second die in a direction perpendicular to the first side of the second die, wherein a second portion of the first die extends outside of the area, wherein the subpackage includes one or more conductive pathways located between the second side of the first die and the second side of the subpackage, and wherein the one or more conductive pathways are coupled to the second portion of the first die.

10. The computing device of claim 9, wherein:
the second die is directly electrically coupled to the second side of the first die.

11. The computing device of claim 9, wherein:
the second die is electrically coupled to the second side of the first die in the first portion of the first die.

12. The computing device of claim 9, wherein:
the computing device is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

13. The package assembly of claim 1, wherein the one or more conductive pathways electrically couple the first side of the second die to the second side of the first die.

14. The package assembly of claim 1, wherein the subpackage further includes an additional layer located between the second side of the subpackage and the second side of the first die, wherein the one or more conductive pathways are formed in the additional layer.

15. The package assembly of claim 1, wherein the one or more conductive pathways couple the second side of the first die to a first end of a pass through via.

16. The package assembly of claim 15, wherein a second end of the pass through via, opposite the first end, is coupled to the one or more package-level interconnect contacts, and wherein the first die is electrically coupled to the one or more package-level interconnect contacts by the pass through via.

17. The computing device of claim 9, wherein the one or more conductive pathways electrically couple the first side of the second die to the second side of the first die.

18. The computing device of claim 9, wherein the one or more conductive pathways couple the second side of the first die to a first end of a pass through via.

19. The computing device of claim 18, wherein a second end of the pass through via, opposite the first end, is coupled to the circuit board by the one or more package-level interconnects, and wherein the first die is electrically coupled to the circuit board by the pass through via.

20. The computing device of claim 9, wherein the subpackage further includes an additional layer located between the second side of the subpackage and the second side of the first die, wherein the one or more conductive pathways are formed in the additional layer.

* * * * *

UNITED STATES PATENT AND TRADEMARK OFFICE
CERTIFICATE OF CORRECTION

| | | Page 1 of 1 |
|---|---|---|
| PATENT NO. | : 9,287,248 B2 | |
| APPLICATION NO. | : 14/104877 | |
| DATED | : March 15, 2016 | |
| INVENTOR(S) | : John S. Guzek et al. | |

It is certified that error appears in the above-identified patent and that said Letters Patent is hereby corrected as shown below:

In the Claims

Column 12
Line 36, "…defined b extension…" should read – "…defined by extension…"

Column 13
Line 29, "…defined b extension…" should read – "…defined by extension…"

Signed and Sealed this
Thirty-first Day of May, 2016

Michelle K. Lee
*Director of the United States Patent and Trademark Office*